United States Patent [19]
Ashdown et al.

[11] Patent Number: 6,157,543
[45] Date of Patent: *Dec. 5, 2000

[54] CASE FOR CIRCUIT BOARD

[75] Inventors: Glynn Russell Ashdown, Lake Bluff; John Brett Barry, Downers Grove, both of Ill.

[73] Assignee: Power Trends, Inc., Warrenville, Ill.

[*] Notice: This patent issued on a continued prosecution application filed under 37 CFR 1.53(d), and is subject to the twenty year patent term provisions of 35 U.S.C. 154(a)(2).

[21] Appl. No.: 08/833,237

[22] Filed: Apr. 14, 1997

[51] Int. Cl.[7] .............................. H05K 7/14; B65D 85/86; F16B 47/00

[52] U.S. Cl. ........................ 361/759; 361/801; 361/720; 361/825; 206/706; 206/707; 248/309.3

[58] Field of Search ....................................... 361/740, 752, 361/753, 759, 801, 802, 809, 825, 720, 728, 736, 748, 756; 439/62, 377; 211/41.17; 29/832; 206/706, 707, 708, 701, 722, 724, 725; 248/205.04, 205.01, 309.1

[56] References Cited

U.S. PATENT DOCUMENTS

| | | | |
|---|---|---|---|
| 4,080,031 | 3/1978 | Sawford-Atkins | 439/371 |
| 4,441,140 | 4/1984 | Richard | 361/752 X |
| 4,858,070 | 8/1989 | Buron et al. | 361/695 |
| 5,099,391 | 3/1992 | Maggelet et al. | 361/802 X |
| 5,216,578 | 6/1993 | Zenitani et al. | 361/690 |
| 5,481,434 | 1/1996 | Banakis et al. | 361/802 X |
| 5,642,263 | 6/1997 | Lauruhn | 361/801 |
| 5,726,865 | 3/1998 | Webb et al. | 361/801 |

*Primary Examiner*—Jayprakash N. Gandhi
*Attorney, Agent, or Firm*—Hill & Simpson

[57] ABSTRACT

The present invention generally provides a case for a printed circuit board which forms a single in-line pin configuration from an edge connected circuit board. The case includes a frame enclosing the edges of the circuit board and a base at a mounting plane side of the frame. Connector pins affixed to the edge connectors of a printed circuit board are secured to the printed circuit board and extend from the base. A tab extending generally parallel to the frame from an edge of the base provides a smooth vacuum pick up engagement surface for handling and placement of the present case.

20 Claims, 3 Drawing Sheets

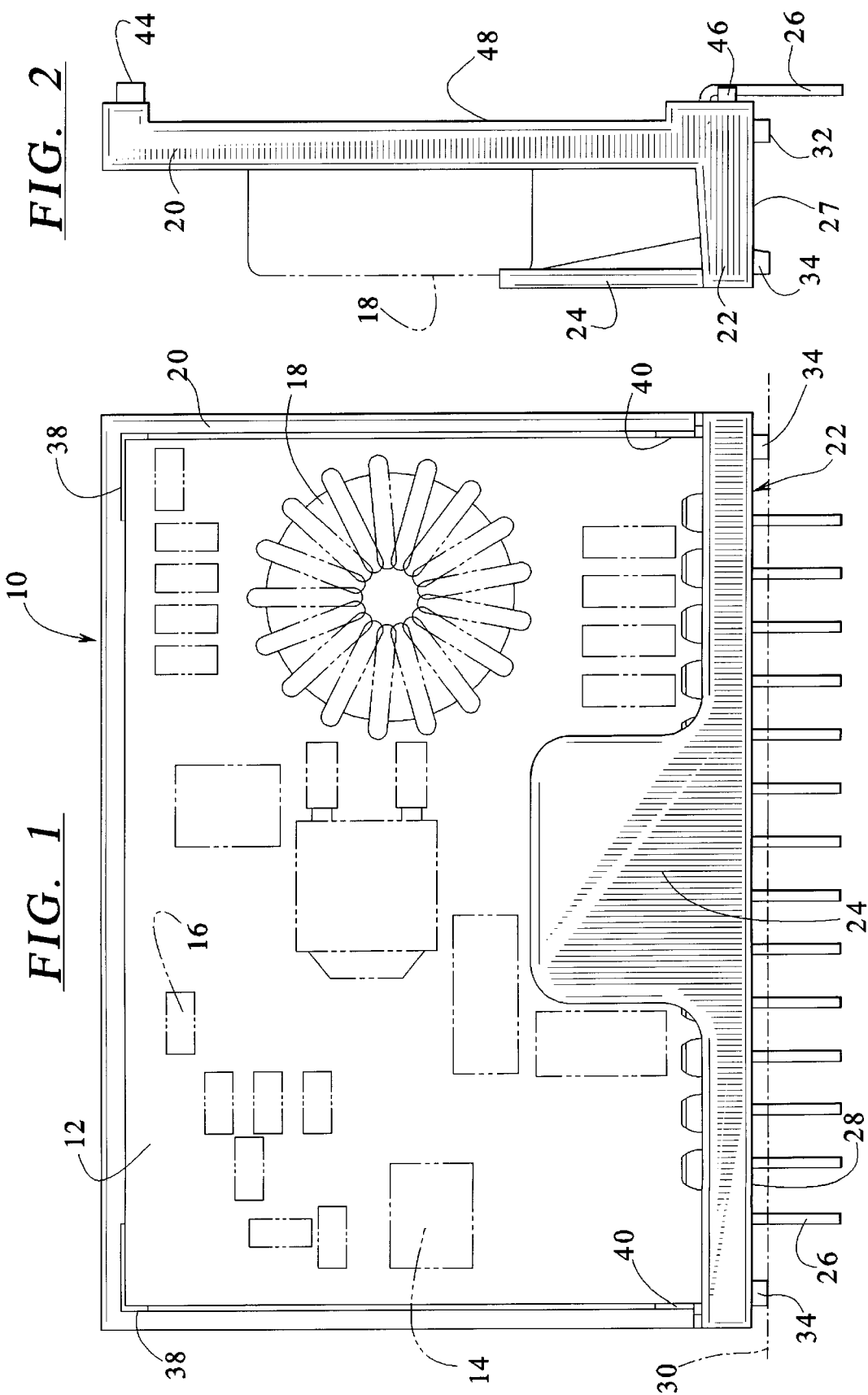

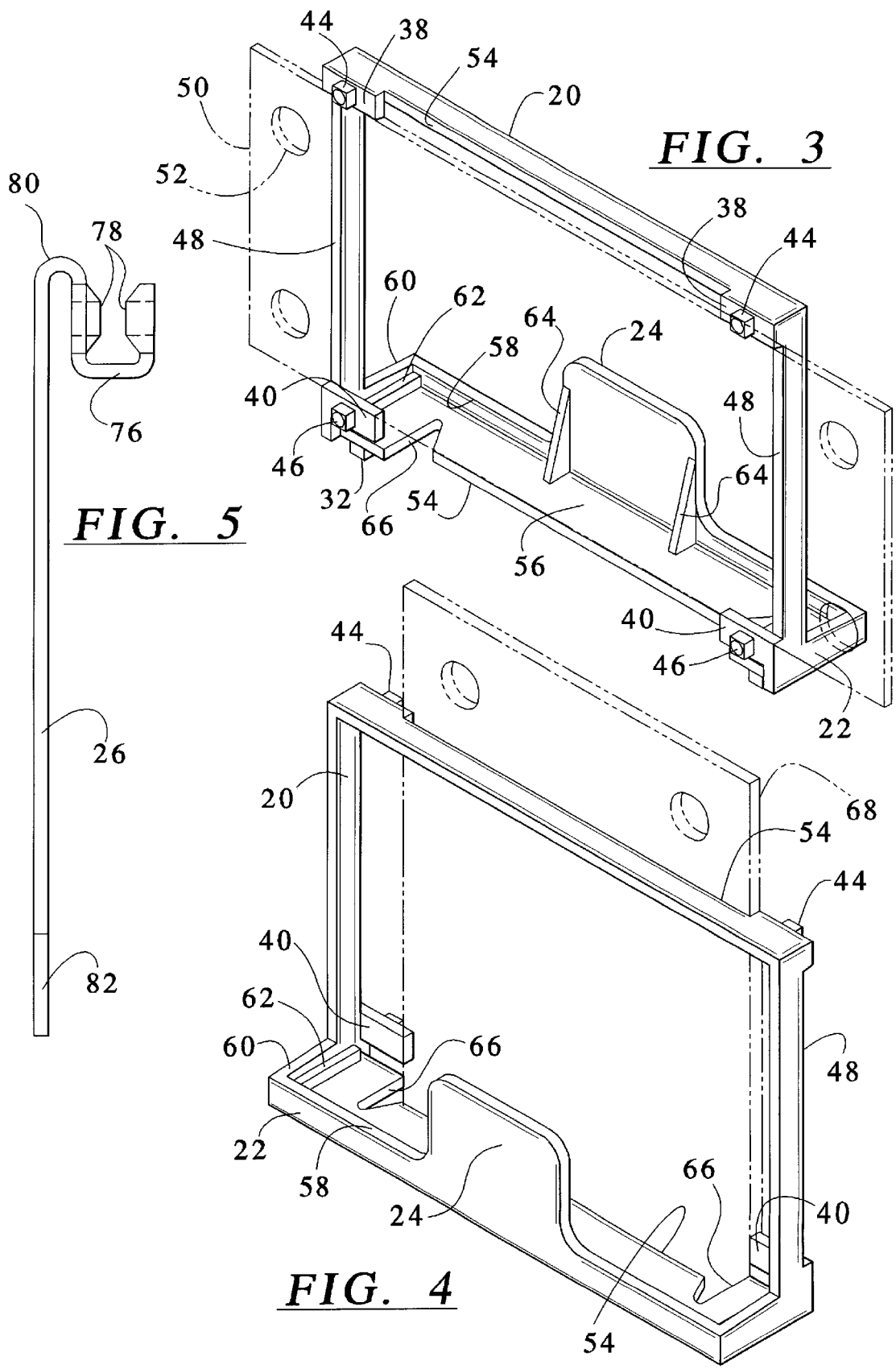

CASE FOR CIRCUIT BOARD

BACKGROUND OF THE INVENTION

1. Field of the Invention

The present invention relates generally to a holder for circuit boards and, more particularly, to a case for supporting an auxliary circuit board for positioning and mounting in a main circuit.

2. Description of the Related Art

Circuit boards on which are mounted various electronic components and which most commonly have printed circuit connections extending between the electronic components may be connected into other circuits. One type of connection provides pins extending from one edge of the circuit board for connection into a connector or openings. Mounting such a circuit board in the connectors or openings can be a problem due to difficulties in handling the circuit board during picking and placing.

Holders or cases for circuit boards have been used which support the circuit boards during picking and placing, as well as providing a mounting plane for stability when mounted. The pins extend from an edge or side of the holder. The known holders are in the shape of a box that is closed in a water tight fashion to enclose the circuit board. The closed box provides a surface for vacuum pick up for pick and place. During manufacturing steps, such as washing of the solder connections, the washing fluid can become trapped in the case and result in problems for the circuit board. The closed case also traps heat from the circuit board. The closed case uses potting compound to support the circuit board, which requires additional manufacturing steps.

SUMMARY OF THE INVENTION

An object of the present invention is to provide a case for circuit boards which support the circuit boards during placement and positioning of the board and while the board is in place at the connection location. Another object of the invention is provide a circuit board case that is open to permit liquid, heat and humidity to escape from the circuit board. Yet another object is to reduce the time and expense of mounting the board in the case.

As a particular advantage, the open circuit board case incorporates a vacuum pickup engaging surface for engagement by a vacuum pickup so that the circuit board case can be handled for pick and place operations. Pick and place operations are aided by the lower weight of the open case. The open case also provides a dramatic decrease in the production time required for handling and mounting the circuit board in the case. The case also provides a positive mounting plane for the circuit board as well as for the case itself on which the case is set during mounting. Two such orthogonal mounting planes are available, one vertical and one horizontal depending on the mounting orientation of the case. The case facilitates accurate mounting of the circuit board.

These advantages and features of the invention are provided in a case for a circuit board having a frame enclosing the edges of the board. The frame has tabs extending inward, such as from the corners, to which the circuit board is attached, for example, by adhesive so that the circuit board is at a defined position within the case. One edge of the frame has a base portion that extends in a direction perpendicular to the plane of the circuit board. The base includes an engagement tab for vacuum pick up. The front and back of the frame are open for ready egress of liquids and heat.

The open frame is adapted for thermal contact of the circuit board with a heat conducting plate which serves as a heat sink. Legs are provided on the frame at one and preferably two surfaces to define the vertical or horizontal mounting planes of the case.

BRIEF DESCRIPTION OF THE DRAWINGS

FIG. 1 is a plan view of the circuit board case of the present invention with a circuit board shown mounted therein in phantom;

FIG. 2 is a side elevational view of the circuit board case of FIG. 1;

FIG. 3 is a perspective view generally from the back of the circuit board case of FIGS. 1 and 2 showing a heat tab in phantom;

FIG. 4 is a perspective view generally from the front of the circuit board case of FIG. 3 showing another embodiment of a heat tab in phantom;

FIG. 5 is a side elevational view of a contact pin for use in the present circuit board case.

DETAILED DESCRIPTION OF THE PREFERRED EMBODIMENTS

Figure 6:
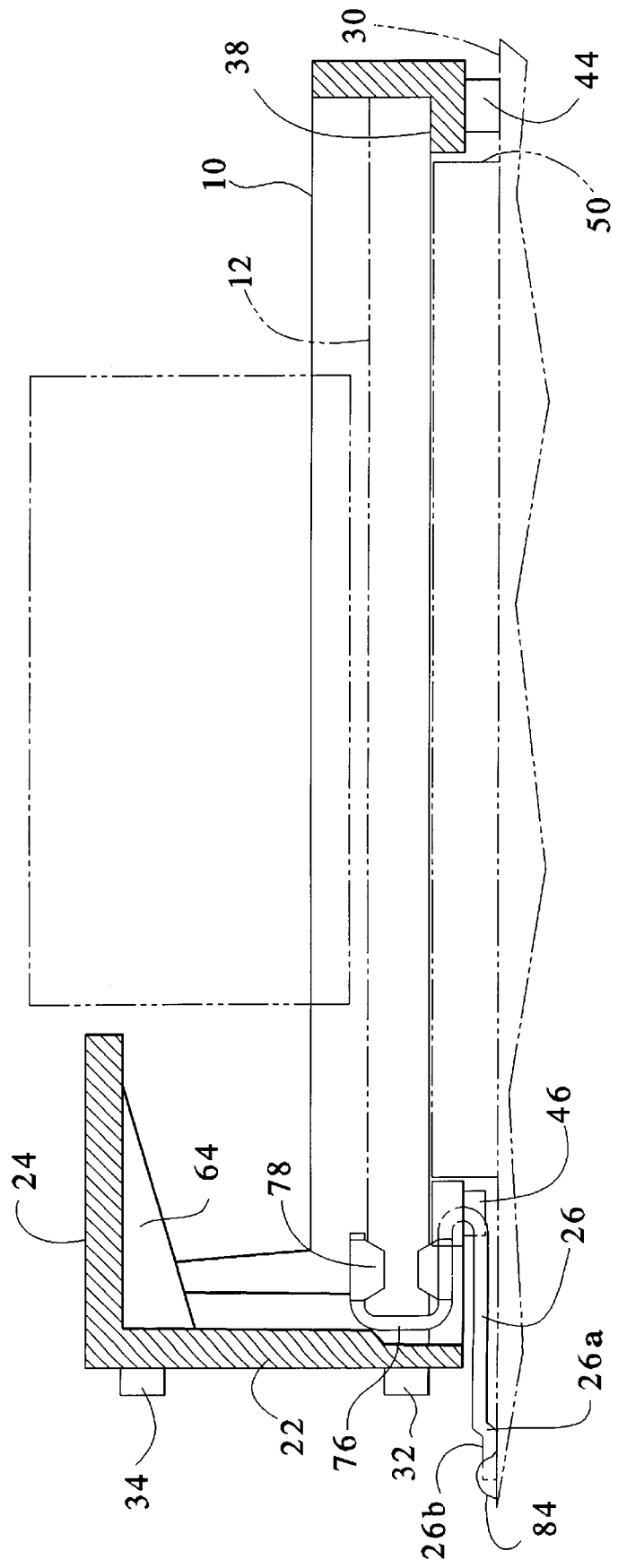
FIG. 6 is a side sectional view of the present case mounted horizontally with a surface mount connection.

In FIG. 1 is shown a case 10 for mounting a circuit board 12 as a SIP (single in-line pin) mounting for through-hole or surface mounting. The circuit board 12 is rectangular in shape, although other shapes are possible, and has a generally planar configuration with circuit components 14 mounted on one side thereof. In the illustrated embodiment, the circuit elements can include integrate circuit chips, smaller circuit components 16 such as surface mounted resistors and diodes, and larger components such as capacitors and toroid coils 18. The larger components 18 extend outward from the surface of the circuit board 12 for a distance and need protection during handling of the circuit board such as during manufacture.

The case 10 has a frame portion 20 that wraps around the rectangular perimeter of the circuit board 12 to provide protection at the edges of the circuit board. The frame 20 is of a size and shape that corresponds to the size and shape of the circuit board and can be a variety of shapes, i.e. squares or rectangles, etc, as needed. At one edge, the case 10 has a base 22 that extends perpendicularly outward from the components side of the circuit board 12 for a distance preferably greater than the larger elements 18 on the board. The base 22 primarily provides a vertical and horizontal mounting surface and secondarily provides protection of the circuit elements on the board 12. An engagement or pickup tab 24 extends from the base 22 generally parallel to the frame 20 to support automatic pick and place for surface mounting. The tab 24 is rectangular, although other shapes are possible, and either centered on the base 22 or offset as necessary to provide clearance for large components, extending over or at least toward the center of gravity of the case 10. This enables the case to be picked up from the tab 24 with less risk of falling off. The tab 24 has a flat, smooth vacuum engagement surface for a vacuum pickup so that the equipped case 10 may be engaged by a vacuum pickup head for manipulation and placement into the appropriate contacting location.

The frame 20 is formed in one piece with the base 22 and the pickup tab 24. In one embodiment, the case 10 is molded of Stanyl, a 30 percent glass filled nylon 46 flame retardant material (UL94Vo).

Edge connector locations found on the lower (with respect to FIG. 1) side of the circuit board 12 are contacted by contact pins 26 which extend downwardly from the present case 10 in a single in-line pin configuration. The pins 26 extend through a bottom panel 28 of the present case 10 at the lower side. When the pins 26 are connected by, for example, extending through openings in another circuit board (indicated by a broken line 30 showing the mounting plane), the case 10 rests on legs 32 and 34. The vertical mount legs 32 and 34 ensure correct positioning on the mounting surface 30 in the vertical position.

Instead of using potting compound to mount the circuit board, the board 12 is mounted by being adhered to corner tabs 38 and 40, see FIGS. 3 and 4 at the corners of the board 12. Preferably, an epoxy is placed on the tabs 38 and 40 or 38 only and the circuit board 12 is positioned in the case against the tabs. The gluing on tab 40 can be avoided since the pins hold that side. The circuit board is thereby held in place on the tabs 38 and 40 and is mounted there with a dramatic reduction in production time compared to closed cases.

In the side view of FIG. 2, the case 10 includes the frame portion 20 which wraps around the edges of the circuit board 12 and the base 22 at the lower side. The vertical mounting legs 32 and 34 are at the rear and front edges, respectively, of the base 22 for stability and alignment for vertical mounting on the mounting surface. In addition to the legs 32 and 34 on the bottom, the present case also includes horizontal mounting legs 44 and 46 at the back on which the case 10 rests for flat mounting. In particular, one end of the frame 20 has a pair of legs 44 and the other end of the frame 20 has a pair of legs 46. The legs 46 extend for a distance sufficient to prevent mashing of the pins 26 when the pins are shaped for surface mounting. The legs 46 are preferably 0.010 to 0.030 inch from the mounting surface when the surface mount pins are on the mounting surface to ensure contact of the pins with contacting locations.

Since the circuit board 12 held in the present case incorporates a wound toroidal coil component 18 which extends perpendicular to the circuit board surface, the base 22 of the present case 10 extends perpendicularly to the circuit board direction sufficient to extend beyond the toroidal coil component 18 or the highest component on the circuit board surface. In FIG. 2, the vacuum engaging tab 24 can also be seen extending from the base 22.

The connector pins 26 which form the single in-line pin configuration extend from the back of the present case. The pins can be shaped for surface mounting. The back side of the frame 20 has a cut-out 48 for receiving a heat conductive plate, as will be discussed later.

In FIG. 3, the base 22 and the arrangement of legs 44 and 46 on the back side of the printed circuit board case 10 can be seen. The corner tabs 38 and 40 are provided, one at each corner of the frame 20 against which the printed circuit board 12 is positioned and to which the circuit board is adhered by epoxy. The cut out 48 is on each vertical section of the frame 20. The cut out 48 accepts a heat conducting plate 50 that is adhered to the rear side of the circuit board 2 by a thermally conductive, electrically insulating adhesive so that heat is conducted away from the circuit board 12. The heat conducting plate 50 extends from each side of the frame 20 at the cut-outs 48 and has two openings 52 at each side for engagement during handling. One such opening 52 per side is also contemplated.

A second pair of cut outs 54 are in the horizontal top portion of the frame 20 and in the base 22 at the rear side. The corner tabs 38 and 40 extend only to a limited extent both horizontally and vertically so as to provide clearance for the heat conducting plate 50 or a plate 68.

The base 22 as seen in FIG. 3 is in the form of a tray with a bottom plate 56, a front lip 58 and two side lips 60. At the sides, additional reinforcing portions 62 are formed in the corners. Also in FIG. 3 can be seen the upwardly projecting tab 24 at the front side of the base 22. The tab 24 is supported by support flanges 64 which extend from the bottom plate 56 to the back of the tab 24. The support flanges 64 prevent distortion of the tab 24 out of a plane parallel with the present frame so that vacuum pick at the tab 24 up is assured.

The bottom plate 56 is provided with notches 66 that interrupt the extent of the bottom plate 56 across the base 22. The notches 66 accommodate any distortion of the present case resulting from mounting of the circuit board therein so that the sides of the base 22 remain square rather than bowing outward.

FIG. 4 provides another view of the present circuit board case 10 including the vacuum engaging mounting tab 24 at the front side of the base 22 and the corner tabs 38 and 40 at the back of the frame 20 of the present case. In FIG. 4 is shown in broken outline a heat conducting plate 68 which is positioned in the cut out 54 at the top of the frame 20 and in the base 22. The plate 68 or 50 is of anodized aluminum in a preferred embodiment. The connecting pins 26 extend through the cut out 54 in the base 22 so the lower cut out 54 extends forward farther than the upper cut out 54 to provide clearance for the pins 26. In FIG. 5 is shown the connecting pin 26, a plurality of which are provided on the connecting edge of the printed circuit board 12 as shown in FIG. 1. The connecting pin 26 includes an engagement loop 76 having a pair of opposed inwardly projecting contact locations 78 of solder which engage and are soldered to the edge connectors of the printed circuit board 12. From the engagement locations 78, the connecting pin 26 loops upward at 80 and then is bent backward on itself to extend downwardly from the present case. The lower end 82 of the connecting pin 26 is tapered for easy insertion into a connecting location on the mounting plane into which the single in-line pin circuit board case of the present invention is mounted. In a preferred embodiment, the present pins are 0.017" by 0.017" for added strength and ease of connectibility.

Thus, there is shown and described a case 10 for enclosing printed circuit boards 12 which provides a shell to protect the components mounted on the printed circuit board 12 as well as which has a open design for thermal air movement and moisture drainage out of the case. The present case provides for easy pick and placement of the case by a vacuum pickup head.

Referring now to FIG. 6, the tab 24 is parallel to the mounting plane defined by the main circuit board 30 so that the vacuum pick up surface on the tab 24 provides simple pick and place positioning of the present case 10 at the appropriate mounting position. The support flanges 64 prevent the tab 24 from sagging to a position out of parallel, such as may result during heating of the case during adhesive curing or soldering operations.

The heat conducting plate 50 abuts the back side of the circuit board 12 and rests on the main circuit board 30. Heat is thereby dispersed from the circuit board 12 to the plate 50 for air cooling and for dispersion to the main circuit board 30. In the horizontal position as shown in FIG. 6, the case rests on the legs 44 at one end and on the pins 26 at the other end. The pins 26 are shaped with a double bend 26a to provide a surface mount connection end 26b which is against the main circuit board 30 and is soldered thereto as indicated by solder 84.

Although other modifications and changes may be suggested by those skilled in the art, it is the intention of the inventors to embody within the patent warranted hereon all changes and modifications as reasonably and properly come within the scope of their contribution to the art.

We claim:

1. A case for a printed circuit board, comprising:

a frame extending about edges of a printed circuit board, said frame including four continuous sides;

securing tabs extending inwardly from said frame against which the printed circuit board is secured in said frame;

a base along one side of said frame, said base extending perpendicular to a major plane of said frame;

a plurality of connector pins connected along a connection edge of the printed circuit board, said connecting pins extending from said circuit board case at said base; and an engagement tab extending from an edge of said base in a direction generally parallel to said frame and providing a smooth vacuum pickup surface, said engagement tab including at least two contiguous free sides.

2. A case as claimed in claim 1, wherein said frame is open in both directions perpendicular to a surface of the printed circuit board.

3. A case as claimed in claim 1, further comprising:

a plurality of legs extending from said base in a direction generally parallel to said plane of said frame, said plurality of legs defining a mounting plane for said case.

4. A case as claimed in claim 1, further comprising:

a plurality of legs extending from said frame generally in a direction perpendicular to said frame and in a direction opposite said base, said plurality of legs defining a mounting plane for said case, said mounting plane being substantially parallel to a major plane of the circuit board.

5. A case as claimed in claim 1, further comprising:

means defining a heat dissipation plate mounting location on said frame; and a heat dissipation plate mounted to said frame at said means defining the heat dissipation plate mounting location, said heat dissipation plate being generally parallel to said frame.

6. A case for mounting a circuit board to a mounting location, comprising:

a base defining a first mounting plane for vertical mounting;

a frame extending perpendicularly from said base and defining a mounting space for mounting the circuit board at an auxiliary mounting plane, said frame being open to both directions perpendicular to said auxiliary mounting plane, said frame defining a second mounting plane substantially perpendicular to said first mounting plane, said frame including first and second side members extending perpendicularly from said base and a top member extending between said first and second side members generally parallel to said base and permanently formed with said first and second side members so as to be permanently fixed thereto;

attachment tabs extending inwardly of said frame to which the circuit board is affixed in the mounting space.

7. A case as claimed in claim 6, further comprising:

means defining a heat dissipation plate mounting location on said frame; and a heat dissipation plate mounted to said frame at said means defining the heat dissipation plate mounting location, said heat dissipation plate being parallel to said auxiliary mounting plane for mounting abutting the circuit board.

8. A case as claimed in claim 6, further comprising:

a vacuum pickup surface on said base, said vacuum pickup surface extending substantially parallel to said frame.

9. A case as claimed in claim 8, wherein said vacuum pickup surface is on a tab extending from said base.

10. A case as claimed in claim 6, wherein the circuit board is an auxiliary circuit board and said mounting location is a main circuit board.

11. A case for mounting a circuit board to a mounting location, comprising:

a base defining a first mounting plane for vertical mounting;

a frame extending perpendicularly from said base and defining a mounting space for mounting a circuit board at an auxiliary mounting plane, said frame being open to both directions perpendicular to said auxiliary mounting plane, said frame defining a second mounting plane substantially perpendicular to said first mounting plane;

attachment tabs extending inwardly of said frame to which the circuit board is affixed in the mounting space;

a vacuum pickup surface on said base, said vacuum pickup surface extending substantially parallel to said frame, said vacuum pickup surface is on a tab extending from said base; and support flanges extending between said tab and said base.

12. A case for mounting a circuit board to a mounting location, comprising:

a base defining a first mounting plane for vertical mounting;

a frame extending perpendicularly from said base and defining a mounting space for mounting a circuit board at an auxiliary mounting plane, said frame being open to both directions perpendicular to said auxiliary mounting plane, said frame defining a second mounting plane substantially perpendicular to said first mounting plane;

attachment tabs extending inwardly of said frame to which the circuit board is affixed in the mounting space, said base including a planar portion extending substantially perpendicular to said frame, and said planar portion defining notches in said planar portion adjacent opposite ends thereof.

13. A case for mounting a circuit board to a mounting location, comprising:

a rectangular frame having four continuous sides permanently affixed to one another, at least three of said continuous sides lying in a plane of the circuit board adjacent edges of the circuit board, a fourth of said continuous sides lying outside a plane of the circuit board;

horizontal mounting portions extending from a first side of said rectangular frame to define a horizontal mounting plane for placement of said rectangular frame on the mounting location in a horizontal position;

a base extending perpendicular from said horizontal mounting plane and including said fourth of said continuous sides;

vertical mounting portions extending from said base to define a vertical mounting plane for placement of said rectangular frame on the mounting location in a vertical position.

14. A case as claimed in claim 13, further comprising:

connector pins on the circuit board extending through said vertical mounting plane generally at said horizontal mounting plane.

15. A case as claimed in claim 13, wherein the circuit board is an auxiliary circuit board and said mounting location is a main circuit board.

16. A case for mounting a circuit board to a mounting location, comprising:

a rectangular frame having four continuous sides, at least three of said continuous sides lying in a plane of the circuit board adjacent edges of the circuit board, a fourth of said continuous sides lying outside a plane of the circuit board;

horizontal mounting portions extending from a first side of said rectangular frame to define a horizontal mounting plane for placement of said rectangular frame on the mounting location in a horizontal position;

a base extending perpendicular from said horizontal mounting plane and including said fourth of said continuous sides;

vertical mounting portions extending from said base to define a vertical mounting plane for placement of said rectangular frame on the mounting location in a vertical position; and an engagement tab extending from an edge of said base in a direction generally parallel to said rectangular frame and providing a smooth vacuum pickup surface.

17. A case for mounting a circuit board to a mounting location, comprising:

a frame having three continuous sides extending about at least three edges of a circuit board;

securing tabs extending inwardly from said frame against which the circuit board is secured in said frame;

a base along one side of said frame to form a fourth side of a rectangular space with said frame, said base extending perpendicular to a major plane of said frame;

a plurality of connector pins connected along a connection edge of the circuit board, said connecting pins extending from the circuit board case at said base and connected to the mounting location; and a heat dissipating plate mounted against said circuit board in parallel to said major plane of said frame, said frame being shaped to accept said heat dissipating plate.

18. A case claimed in claim 17, comprising:

an engagement tab extending from an edge of said base in a direction generally parallel to said frame and providing a smooth vacuum pickup surface.

19. A case as claimed in claim 18, wherein said engagement tab includes at least two contiguous free sides.

20. A case as claimed in claim 17, wherein the circuit board is an auxiliary circuit board and said mounting location is a main circuit board.

* * * * *